United States Patent
Sabatier et al.

(10) Patent No.: US 10,709,042 B2
(45) Date of Patent: Jul. 7, 2020

(54) SINGLE-PIECE COVER FOR AN ELECTRONIC DEVICE

(71) Applicant: SAGEMCOM BROADBAND SAS, Rueil-Malmaison (FR)

(72) Inventors: Pierre Sabatier, Rueil Malmaison (FR); Dominique Susini, Rueil Malmaison (FR); Thierry Alegre, Rueil Malmaison (FR); Romain Dejardin, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 16/329,997

(22) PCT Filed: Aug. 10, 2017

(86) PCT No.: PCT/EP2017/070388
§ 371 (c)(1),
(2) Date: Mar. 1, 2019

(87) PCT Pub. No.: WO2018/046230
PCT Pub. Date: Mar. 15, 2018

(65) Prior Publication Data
US 2019/0208675 A1  Jul. 4, 2019

(30) Foreign Application Priority Data
Sep. 8, 2016  (FR) ...................... 16 58372

(51) Int. Cl.
*H05K 9/00* (2006.01)
*H05K 7/20* (2006.01)
*H01Q 1/52* (2006.01)

(52) U.S. Cl.
CPC ......... *H05K 9/0026* (2013.01); *H01Q 1/526* (2013.01); *H05K 7/20436* (2013.01); *H05K 7/20445* (2013.01); *H05K 9/0024* (2013.01)

(58) Field of Classification Search
USPC .......... 361/818, 816, 799; 174/51, 377, 135; 343/841, 700 MS, 702
See application file for complete search history.

(56) References Cited

U.S. PATENT DOCUMENTS

| | | | | |
|---|---|---|---|---|
| 6,975,272 B2 * | 12/2005 | Yuanzhu | ............... | H01Q 1/3233 343/700 MS |
| 8,487,829 B2 * | 7/2013 | Takisawa | ............. | H01Q 1/1207 343/841 |
| 8,693,204 B2 * | 4/2014 | Malek | .................... | G01C 17/28 361/752 |
| 2005/0122268 A1 * | 6/2005 | Suzuki | ................... | H01Q 1/243 343/702 |
| 2009/0256759 A1 * | 10/2009 | Hill | ........................ | H01Q 1/243 343/702 |
| 2014/0192508 A1 | 7/2014 | Patil et al. | | |
| 2017/0244158 A1 * | 8/2017 | Ali | ........................... | H01Q 1/02 |
| 2018/0115051 A1 * | 4/2018 | Nguyen | ............... | H01Q 1/2283 |

FOREIGN PATENT DOCUMENTS

| | | |
|---|---|---|
| JP | 2011-066039 A | 3/2011 |
| JP | 2011-176673 A | 9/2011 |

* cited by examiner

*Primary Examiner* — Hung S. Bui
(74) *Attorney, Agent, or Firm* — Muncy, Geissler, Olds & Lowe, P.C.

(57) ABSTRACT

A single-piece cover for an electronic device, said cover including: a heat sink; an antenna; a shielding screen; an electrically insulating synthetic material forming outer surfaces of the cover.

14 Claims, 2 Drawing Sheets

SINGLE-PIECE COVER FOR AN ELECTRONIC DEVICE

FIELD OF THE INVENTION

The present invention relates to the field of wireless electronic communication devices, and more particularly to the boxes of wireless electronic devices of the router or gateway type.

BACKGROUND OF THE INVENTION

Electronic devices exist that comprise a box housing specifically an electronic card that is electrically connected to an antenna, and a heatsink for dissipating the heat produced by one or more electronic components of the card while they are in operation. The electronic card also receives an electromagnetic shielding screen and a mechanical protection cover on which the decorative finishes of the device are generally carried.

The multiplicity of the sub-elements making up the electronic device requires numerous assembly operations that affect manufacturing costs of the electronic device as well as logistical costs (storage, transport to the place of production, distribution to the assembly station) of the sub-elements.

These numerous sub-elements also make existing electronic devices bulky, whereas consumers seek equipment that is increasingly compact.

OBJECT OF THE INVENTION

An object of the invention is to provide an electronic device that is compact and that is more economical to manufacture.

SUMMARY OF THE INVENTION

To this end, the invention provides a single-piece cover for an electronic device, the cover comprising:
  a heatsink;
  an antenna;
  a shielding screen; and
  an electrically-insulating synthetic material forming outside surfaces of the cover.

In the meaning of the present application, the term "single-piece" refers to a set of components that are secured to one another in such a manner as to be able to be handled together without the risk of the components becoming separated. In the meaning of the present application, a cover is an outer shell of the product, a part that is visible on the finished product without disassembly and that protects internal components from the outside. A cover therefore provides mechanical protection (from impacts, handling) and depending on the design (without holes), the cover may protect against projections of water, dust, and electrical/electrostatic impulses.

There is thus obtained a single element that combines a plurality of functions, thereby reducing the logistical flows and the volume of assembly operations at the final assembly site of the electronic equipment, and making it possible to improve the compactness of the final electronic equipment.

Advantageously, the antenna is connected to electrical connection means arranged so as to be capable of being connected to the electronic device.

This also improves the compactness of the cover that has the connectors incorporated therein, and also reduces assembly time.

Also advantageously, the shielding screen is connected to equipotential bonding means arranged so as to be capable of being connected to the electronic device.

Thus further improves the compactness of the cover that has the equipotential bonding connectors incorporated therein and likewise reduces assembly time.

For a similar purpose, the cover includes mechanical connection means arranged so as to enable the cover to be fastened to the electronic device.

In a particular embodiment, the cover comprises a metal structure made of a material including copper.

Advantageously, the antenna is embedded in the synthetic material, which provides better compactness of the cover and improves the transmission quality of the antenna.

In a preferred embodiment, the electrical connection means comprise a surface contact and/or a contact including a resilient element.

This makes it possible to eliminate the need for strict dimensional tolerances, thereby reducing manufacturing costs and ensuring long-lasting electrical contact. Preferably, the electrical connection means comprise a coaxial cable connector, ideally of the UFL type.

The use of proven standard connectors makes it possible to reduce supply costs and improves the reliability of the electrical connection.

The invention also provides a method of manufacturing electronic equipment comprising the following steps:
  manufacturing a cover of the above-described type;
  manufacturing an electronic device; and
  assembling the cover and the electronic device together.

Other characteristics and advantages of the invention appear on reading the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figures 1, 2:
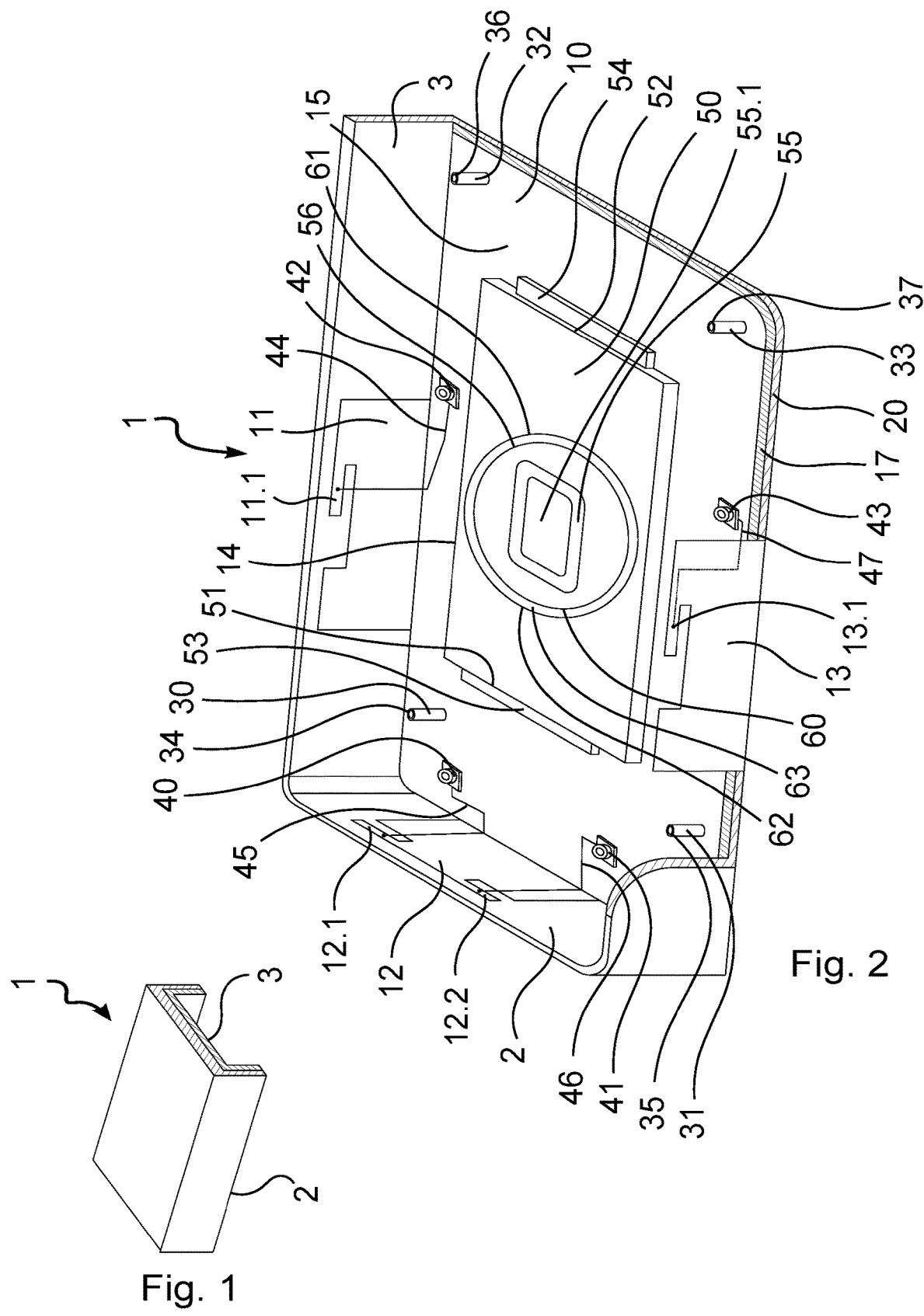
FIG. 1 is a perspective diagram of a cover of the invention.
FIG. 2 is a partially cut-away perspective view of FIG. 1.

With reference to FIGS. 1 and 2, the single-piece cover of the invention, generally given reference 1, is substantially of rectangular box shape and includes a top wall and three adjacent side walls in such a manner that the box has a bottom face 2 that is open and a rear face 3 that is also open.

The cover 1 comprises an antenna structure 10, made of copper, substantially of rectangular shape. The structure 10 has at its periphery three folded-back flaps 11, 12, and 13, and an opening 14 of rectangular shape at its center. An inside surface 15 of the structure 10 defines a reception housing 4 for receiving an electronic device.

The cover 1 also includes a passive heatsink 50, of rectangular shape, housed in the opening 14 of the structure 10 in order to have one face flush with an outside surface 17 of the structure 10 at the top wall of the structure 10. The shorter sides 51 and 52 of the heatsink 50 have rims 53 and 54 projecting from the opening 14 in order to be fastened to the structure 10 and thus ensuring that the heatsink 50 is secured to the structure 10 and that electrical contact is made with the structure 10. A central projection 55 projects from the face 56 of the heatsink 50 away from the face that is flush with the outside surface 17. The central projection 55 is covered with a thermal pad 55.1. A conductive ring 60 of substantially square section extends around the projection 55 and is welded via one face 61 onto the heatsink 50. The face 62 opposite from the face 61 carries an electrically-conductive, compressible foam strip 63.

The cover 1 also includes:

a layer of synthetic material 20—in this example acrylonitrile butadiene styrene (ABS)—that is overmolded onto the structure 10 and the face that is flush with the heatsink 50 in order to cover an outside surface 17 of the structure 10 opposite from the inside surface 15 in such a manner as to form a top wall and three side walls of the cover;

four screw-fastening studs 30 to 33 projecting from the top wall of the structure 10 on the side of the inside surface 15 and that are respectively provided with tapped holes 34 to 37; and four female UFL-type connectors 40 to 43 connected respectively by conductors 44 to 47 to blades 11.1, 12.1, 12.2, and 13.1 cut out in the folded flaps 11 to 13. The conductors 44 to 47 are fastened to the structure 10 by means of spots of solder.

A method of manufacturing a piece of electronic equipment 100 is described below.

In a first stage, the cover 1 and an electronic device are manufactured on two separate production lines that join together in order to enable the cover 1 to be assembled with the electronic device, in a second stage.

Concerning the cover 1, the studs 30 to 33, the connectors 40 to 44, and the conductors 44 to 47 are soldered onto the structure 10 that has been previously cut out and folded to form the opening 14 and the folded flaps 11 to 13. The heatsink 50 is placed in the opening 14 and the synthetic material 20 is then overmolded onto the assembly by injection-molding. A single-piece cover 1 is thus obtained that comprises the heatsink 50, an antenna in the form of the structure 10, and a trim portion made of synthetic material 20. As seen below, the ring 60 forms a shielding screen. The cover 1 may then be stored pending later assembly.

Manufacturing of the electronic part is itself known and is therefore not described in more detail. In this example, the electronic device comprises an electronic card 70 comprising a processor 71, a circular ground conductive track 72 extending around the processor 71, four male UFL connectors 73 to 76, and four holes 77 to 80.

Figure 3:
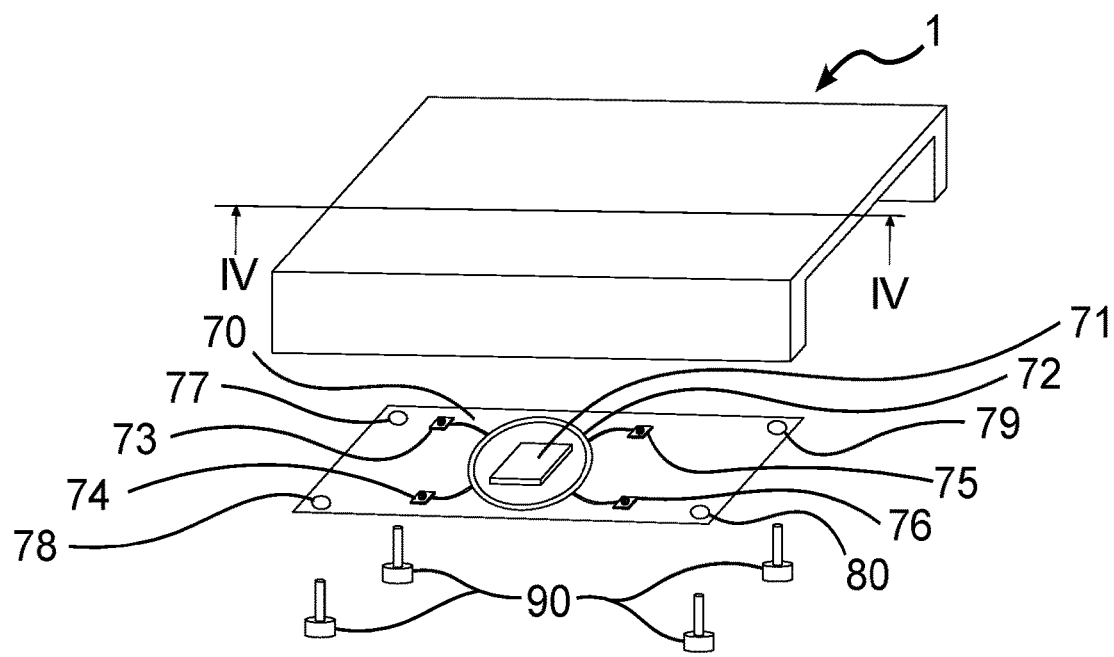
FIG. 3 is a diagrammatic perspective view of a step of a method of assembling a piece of electronic equipment of the invention.

In the second stage of the method shown in FIG. 3, the electronic device is placed inside the housing 4. Screws 90 engaged through the holes 77 to 80 are engaged in the tapped holes 34 to 37 and are fastened therein. While the electronic device is being put into position in the housing 4 and the screws 90 are being tightened, the male UFL connectors 73 to 76 of the electronic card 70 become engaged in the female UFL connectors 40 to 43 of the cover 1, thus forming an electrical connection between the electronic card 70 and the antenna structure 10.

Figure 4:
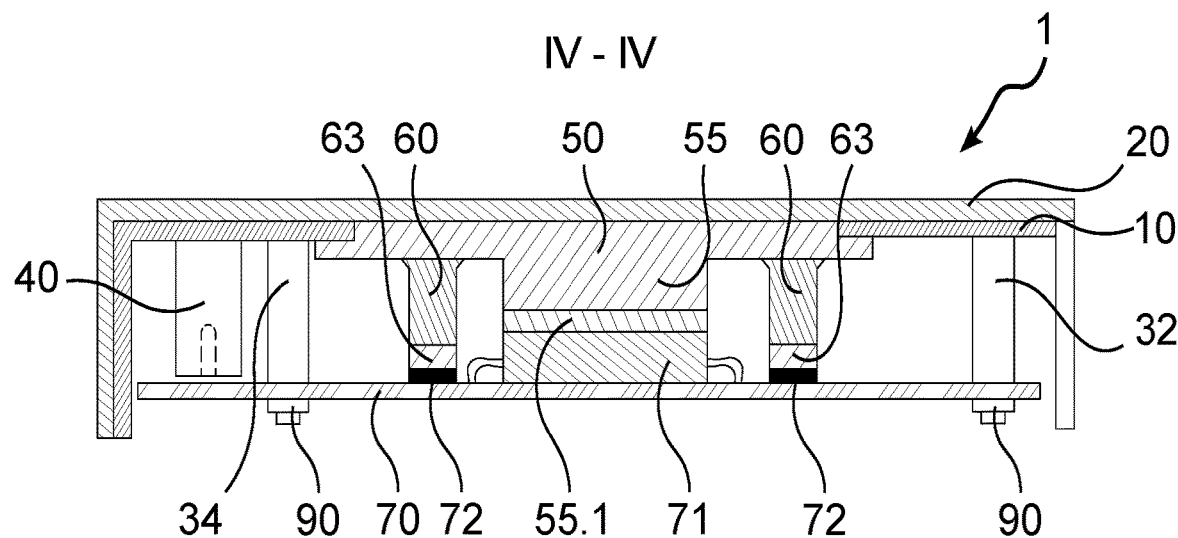
FIG. 4 is a longitudinal section view on the plane IV-IV of the FIG. 3 electronic equipment once assembled.

As can be seen in FIG. 4, once the screws have been tightened 90, the thermal pad 55.1 of the heatsink 50 is in contact with the top surface of the processor 71, thus ensuring that heat generated by the processor 71 is transferred to the heatsink 50. While the screws 90 are being tightened, the conductive foam 63 of the ring 60 also comes into contact with the conductive track 72 of the electronic card 70, thus forming equipotential bonding with said track.

The ring 60 that extends around the processor 71 then shields the processor 71 electromagnetically.

There is thus obtained a piece of electronic equipment 100 resulting from a single operation of assembling the cover 1 and the electronic card 70 together. The screws 90 enable the electronic card 70 to be mechanically connected to the cover 1 while providing durable and reliable electrical connections between firstly the structure 10, the heatsink 50, and the shielding 60, and secondly the electronic card 70.

It should be observed that the bottom face of the electronic device has its bottom face forming the bottom surface of the electronic equipment and a side face forming one of the side surfaces of the electronic equipment, whereas the cover forms the top surface and three side faces of the electronic equipment.

Naturally, the invention is not limited to the embodiments described but encompasses any variant coming within the ambit of the invention as defined by the claims.

In particular:

although in this example the cover is of rectangular shape, the invention also applies to covers of other shapes, in particular for reasons of providing an attractive appearance. In the same way, the cover may have a single open face or more than two open faces;

although in this example the antenna structure is made of copper, the invention also applies to other materials, such as for example tinned steel or any other suitable material including copper;

although in this example the layer of synthetic material is a layer of ABS deposited by overmolding in order to form the outside surfaces of the cover, the invention also applies to other types of electrically-insulating synthetic materials, such as for example polyamide, as well as to other methods of depositing this material such as for example applying a layer of thermoformed material, depositing a layer of epoxy paint or an adhesive, heading/staking or screw-fastening the synthetic material on the antenna structure;

although in this example the synthetic material is deposited on one of the faces of the antenna structure, the invention also applies to an antenna structure embedded in the synthetic material;

although in this example the cover has four screw-fastening studs, the invention applies to other mechanical connection means arranged to enable the cover to be fastened to the electronic device, such as for example by heading/staking, adhesive, or clip-fastening;

although in this example the conductors are fastened to the antenna structure by soldering, the invention also applies to other means of fastening the conductors to the cover, such as for example by clip-fastening, adhesive, or welding;

although in this example the heatsink is fastened to the cover by gluing, the invention also applies to other means of fastening the heatsink to the cover, such as for example by clip-fastening, soldering or welding;

although in this example the cover includes a conductive ring that is secured to the heatsink, the invention also applies to other types of shielding screen, such as for example a polygonal metal box connected to the antenna by electrically-insulating fastenings;

although in this example the shielding screen is connected to the electronic device by a compressible conductive foam strip, the invention also applies to other means of equipotential bonding, such as for example screw-fastening, clip-fastening, resilient connection, springs, spring blades, or direct contact;

although in this example the cover has four screw-fastening studs, the invention applies to other means of mechanical connection arranged to enable the cover to be fastened to the electronic device, such as for example by heading/staking, adhesive, or clip-fastening;

although in this example the cover has UFL connectors, the invention also applies to other types of electrical connection means, such as for example a surface contact or a contact including a resilient element; and although in this example the cover has an antenna structure made from a metal plate, the invention also applies to other types of antenna, such as for example a conductive wire, a wire loop, or any means suitable for wireless transmission.

The invention claimed is:

1. A single-piece cover for an electronic device, the cover comprising:
    a heatsink;
    an antenna;
    a shielding screen; and
    an electrically-insulating synthetic material forming outside surfaces of the cover, wherein the electrically-insulating synthetic material is overmolded onto the antenna.

2. The cover according to claim 1, wherein the antenna is connected to electrical connection means arranged so as to be capable of being connected to the electronic device.

3. The cover according to claim 2, wherein the electrical connection means include a surface contact and/or a contact including a resilient element.

4. The cover according to claim 2, wherein the electrical connection means include a coaxial cable connector.

5. The cover according to claim 4, wherein the coaxial cable connector is of a UFL type.

6. The cover according to claim 1, wherein the shielding screen is connected to equipotential bonding means arranged so as to be capable of being connected to the electronic device.

7. The cover according to claim 6, wherein the equipotential bonding means for bonding with the electronic device include a compressible conductive foam.

8. The cover according to claim 1, including mechanical connection means arranged so as to enable the cover to be fastened to the electronic device.

9. The cover according to claim 8, wherein the mechanical connection means include at least one threaded hole designed for receiving a screw.

10. The cover according to claim 1, wherein the cover includes a metal structure made of a material including copper.

11. The cover according to claim 10, wherein the conductors extending between the antenna and the electrical connection means are fastened to the metal structure.

12. The cover according to claim 1, wherein the antenna is embedded in the synthetic material.

13. The cover according to claim 1, wherein the synthetic material is deposited by applying a layer of thermoformed plastic or by epoxy paint deposition.

14. A method of manufacturing electronic equipment comprising the following steps:
    manufacturing a cover according to claim 1;
    presenting the electronic device; and
    assembling the cover and the electronic device together.

* * * * *